(12) United States Patent
Lin

(10) Patent No.: US 7,642,500 B2
(45) Date of Patent: Jan. 5, 2010

(54) TRUE COLOR IMAGE BY MODIFIED MICROLENS ARRAY HAVING DIFFERENT EFFECTIVE AREAS

(75) Inventor: Chin-Min Lin, Taiping (TW)

(73) Assignee: Taiwan Semiconductor Manufacturing Company Ltd., Hsin-Chu (TW)

( * ) Notice: Subject to any disclaimer, the term of this patent is extended or adjusted under 35 U.S.C. 154(b) by 0 days.

(21) Appl. No.: 12/186,704

(22) Filed: Aug. 6, 2008

(65) Prior Publication Data

US 2008/0290255 A1 Nov. 27, 2008

Related U.S. Application Data

(63) Continuation of application No. 11/330,481, filed on Jan. 12, 2006, now Pat. No. 7,446,294.

(51) Int. Cl.
  *H01L 27/00* (2006.01)
(52) U.S. Cl. .............................. 250/208.1; 250/214 R; 250/226; 348/272; 348/273; 348/280; 359/619
(58) Field of Classification Search .............. 250/208.1, 250/214.1, 214 R, 226; 348/272, 273, 280, 348/291, 294, 335, 339; 359/619–626; 257/65, 257/294, 431, 432, 438
  See application file for complete search history.

(56) References Cited

U.S. PATENT DOCUMENTS 6,493,475 B1  12/2002  Lin
6,577,342 B1 * 6/2003  Wester ........................ 348/340
6,829,380 B1  12/2004  Choo et al.
7,126,099 B2  10/2006  Hsu et al.
2001/0009442 A1  7/2001  Fukuyoshi et al.
2002/0140832 A1  10/2002  Summa
2004/0133863 A1  7/2004  Dai et al.
2005/0078377 A1  4/2005  Li et al.
2005/0224694 A1  10/2005  Yaung
2006/0057765 A1  3/2006  Hsu et al.
2006/0183027 A1  8/2006  Lin et al.
2006/0189062 A1  8/2006  Deng et al.
2007/0001100 A1  1/2007  Hsu et al.

\* cited by examiner

*Primary Examiner*—Georgia Y Epps
*Assistant Examiner*—Francis M Legasse, Jr.
(74) *Attorney, Agent, or Firm*—Haynes And Boone, LLP

(57) ABSTRACT

An image sensor array includes a substrate having at least three image sensors located therein. The image sensor array also includes a blue filter positioned proximate to the first image sensor; a green filter proximate to the second image sensor; and a red filter proximate to the third image sensor. A first microlens is positionally arranged with the blue filter and the first image sensor; a second microlens is positionally arranged with the green filter and the second image sensor; and a third microlens is positionally arranged with the red filter and the third image sensor. The first microlens has a larger effective area than the second microlens, and the second microlens has a larger effective area than the third microlens.

16 Claims, 2 Drawing Sheets

US 7,642,500 B2

TRUE COLOR IMAGE BY MODIFIED MICROLENS ARRAY HAVING DIFFERENT EFFECTIVE AREAS

CROSS REFERENCE

This application is a Continuation of U.S. patent application Ser. No. 11/330,481, filed Jan. 12, 2006, the disclosure of which is incorporated herein by reference.

BACKGROUND

The present disclosure relates generally to image sensor arrays and, more specifically, to an image sensor array utilizing a modified microlens array.

Image sensor arrays widely employ in various technologies, including charged coupling device (CCD) image sensors and complimentary metal-oxide-semiconductor (CMOS) image sensors. In general, CCD, CMOS, and other types of image sensor arrays transform a light pattern (i.e., an image) into an electric charge pattern. Image sensor arrays generally include polymer or dielectric microlenses. The microlenses are often arranged in a microlens array, with each microlens in the array being similarly sized and shaped.

In many applications, a selection of wavelengths/colors is received by the image sensor array. For example, red, green, and blue pixels (filtered image sensor elements) are often used in many imaging systems such as a digital camera. It is noted that different photo response sensitivities exist between the different colored pixels. This is inherently the case due to the different wavelengths of the different colors. In continuation of the present example, one pixel's sensitivity to blue light is less than another pixel's sensitivity to green light, which is less than yet another pixel's sensitivity to red light. It is desired to have these sensitivities (for blue, green, and red, in the present example) similar each other, thereby obtaining a more "true color" image.

Accordingly, what is needed in the art is an improved image sensor array, pixel, and method of creating same.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1 and 2 provide cross-sectional views of an image sensor array.

DETAILED DESCRIPTION

Figure 1:
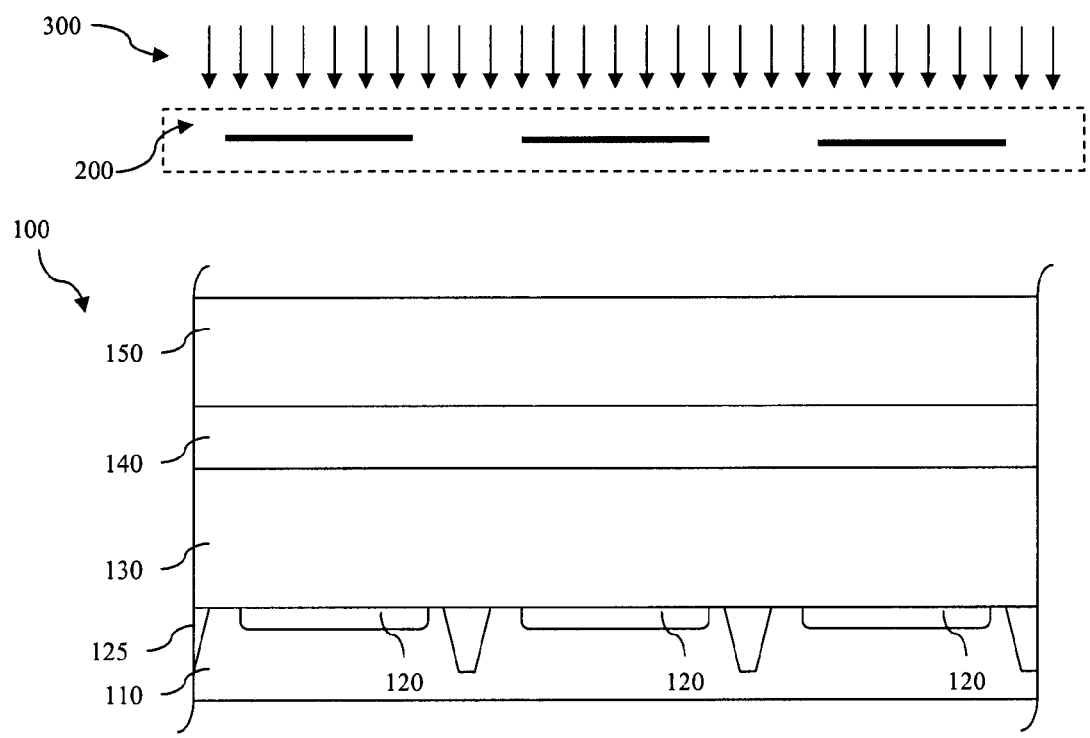
FIG. 1 is a cross sectional view of a lithography system used for creating an image sensor array.

It is to be understood that the following disclosure provides many different embodiments, or examples, of systems and methods benefiting from aspects of the present invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, one embodiment of a semiconductor chip 100 includes a substrate 110 and image sensors 120 formed therein. In the present embodiment, the substrate 110 is a silicon substrate, but in other embodiments the substrate may comprise such things as germanium or diamond. It is understood that front-side and back-side illumination image sensors can benefit from the present invention, with the substrate 110 appropriately configured. For the sake of further example, front-side illumination configuration will be further described.

The substrate 110 may also comprise a compound semiconductor such as silicon carbide, gallium arsenic, indium arsenide, and/or indium phosphide. The substrate 110 may comprise an alloy semiconductor such as silicon germanium, silicon germanium carbide, gallium arsenic phosphide, and/or gallium indium phosphide. The substrate 110 may include an epitaxial layer. For example, the substrate may have an epitaxial layer overlying a bulk semiconductor. Further, the substrate may be strained for performance enhancement. For example, the epitaxial layer may comprise semiconductor materials different from those of the bulk semiconductor such as a layer of silicon germanium overlying a bulk silicon, or a layer of silicon overlying a bulk silicon germanium formed by a process such as selective epitaxial growth (SEG). Furthermore, the substrate 110 may comprise a semiconductor-on-insulator (SOI) structure. For example, the substrate may include a buried oxide (BOX) layer formed by a process such as separation by implanted oxygen (SIMOX). The substrate 110 may comprise a p-type doped region and/or an n-type doped region. The doping may be implemented by a process such as ion implantation. The substrate 110 may comprise lateral isolation features to separate different devices formed on the substrate. In the present embodiment, the image sensors 120 are photodiodes diffused or otherwise formed in the substrate 110 and separated by shallow trench isolation (STI) regions 125.

Aspects of the present disclosure are applicable and/or readily adaptable to image sensor arrays employing various types of devices, including charged coupling device (CCD) and complimentary metal-oxide-semiconductor (CMOS) image sensor applications (e.g., active-pixel sensors), among others. As such, the image sensors 120 may comprise conventional and/or future-developed image sensing devices.

The semiconductor chip 100 includes a passivation layer 130. The passivation layer 130 may comprise silicon nitride (e.g., $Si_3N_4$), silicon oxynitride (e.g., $Si_xN_yO_z$), silicon oxide, silicon dioxide, and/or other materials. The passivation layer 130 may be substantially optically transparent, and may be formed by chemical vapor deposition (CVD), physical vapor deposition (PVD), atomic layer deposition (ALD), spin-on coating, and/or other processes. In one embodiment, the passivation layer 130 has a thickness ranging between about 1 μm and about 50 μm. The passivation layer 130 may further comprise a multilayer interconnect structure formed therein. The multilayer interconnect may include metal lines for lateral connections and via/contact features for vertical connections. The metal lines and via/contact features may be configured such that the image sensors 120 may not be blocked thereby from incident light. The passivation layer 130 may have a multilayer structure such as a layer having the multilayer interconnects embedded therein and a layer to protect the underlying interconnects and the substrate.

The semiconductor chip 100 includes a dielectric layer 140. The dielectric layer 140 may comprise silicon nitride, silicon oxynitride, silicon oxide, silicon dioxide, and/or other materials. The dielectric layer 140 may also comprise a low-k dielectric layer having a dielectric constant less than or equal to about 3.9. The dielectric layer 140 may be formed by CVD, PVD, ALD, spin-on coating, and/or other processes. In furtherance of the present embodiment, the dielectric layer 140 includes a multilayer structure including a planarization layer, a color filter layer, and/or a spacer layer. The dielectric layer 140 may be formed by a method described above and may be substantially planar, possibly the result of chemical-mechanical-polishing (CMP). Different color filters may be positioned such that the incident light is directed thereon and there through. In one embodiment, such color-transparent layers may comprise a polymeric material (e.g., negative photoresist based on an acrylic polymer) or resin. The color filter layer may comprise negative photoresist based on an acrylic polymer including color pigments. The spacer layer is formed to adjust the distance between the overlying microlens array and the underlying image sensors 120. In one embodiment, the dielectric layer 140 has a thickness ranging between about 0.2 μm and about 50 μm.

A layer of photoresist 150 is formed over the semiconductor chip 100 using a method such as spin-on coating. The layer of photoresist 150 may be pre-baked. The photoresist layer may then be exposed to a light source 300 through a photomask 200, wherein the photomask 200 is specially designed according to the present disclosure. It is understood that in the present embodiment, microlenses are formed from the photoresist 150. In other embodiments, one or more intermediate layers can be provided and patterned by the photoresist 150, and these layer(s) can be used to form the microlenses.

Figure 2:
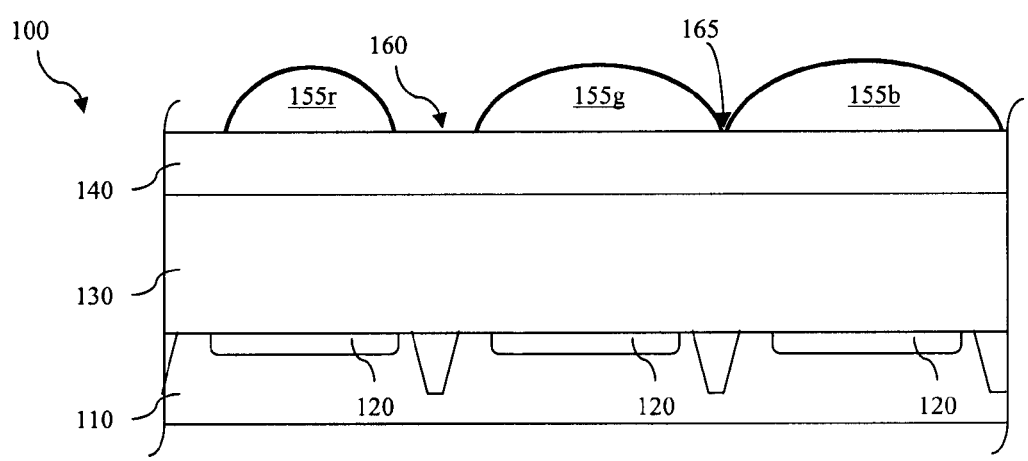

Referring to FIG. 2, three different microlenses are formed, designated with the reference numeral 155r (for red), 155g (for green), and 155b (for blue). It is understood that the drawings and present disclosure are simplified to better illustrate the various embodiments of the present invention. As shown in the figure, the three microlenses (collectively referenced 155) have different effective areas, in the following order:

effective area of microlens 155b>microlens 155g>microlens 155r. Also, in the present embodiment, there is a gap 160 between the red microlens 155r and the green microlens 155g, and there is no gap 165 between the green microlens 155g and the blue microlens 155b. The gap 160 may prevent portions of the incident light from being accurately directed toward the underlying image sensor 120. Various techniques can be used to obtain the different sized microlenses 155, as discussed in greater detail below.

Figure 3:
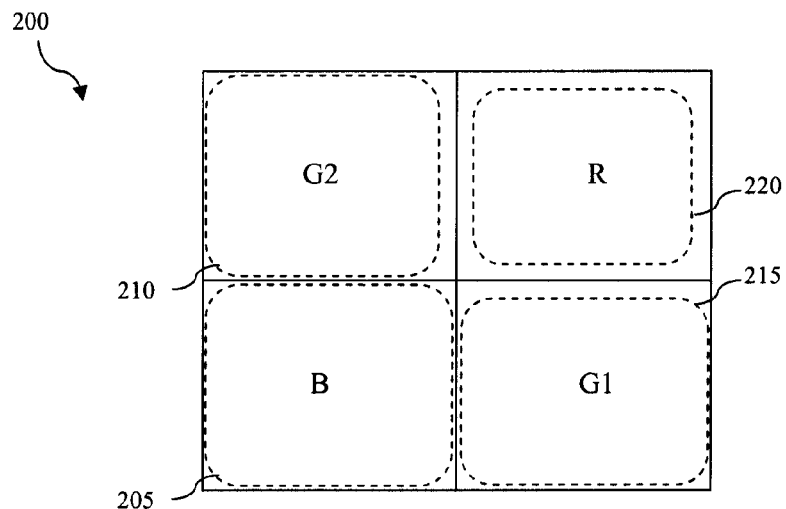
FIG. 3 provides a top view of a mask for use in the lithography system of FIG. 1.

Referring to FIG. 3, in one embodiment, optical proximity correction (OPC) is applied to the mask 200 to make changes in the respective geometries of the microlenses 155. In the present example, the mask 200 is shown having four areas identified as B, G1, G2, and R, which correspond to blue, green, green, and red pixels on the substrate 100 (FIGS. 1-2). Correspondingly, microlens images 205, 210, 215, and 220 are provided to in the areas B, G1, G2, and R, respectively. The microlens images 205, 210, and 220 also correspond to the microlenses 155b, 155g, and 155r, respectively, of FIG. 2.

Figure 4:
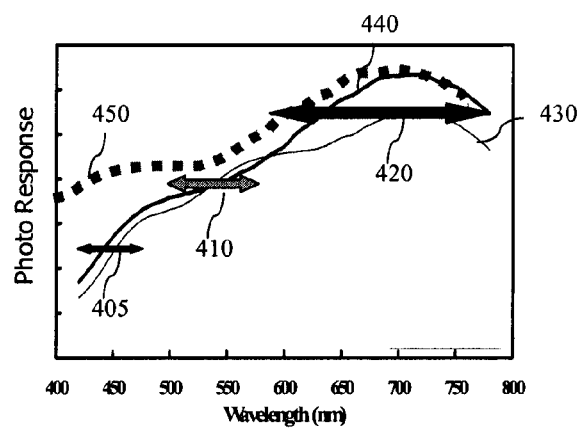
FIGS. 4 and 5 are graphs of a photo response of various image sensor arrays, including the image sensor arrays of FIGS. 1 and 2.

Referring also to FIG. 4, using OPC, features can be applied to one or more of the mask microlens images 205-220 to produce desired alterations to the microlenses 155. The vertical axis shows a photo response. The horizontal axis shows the wavelength of the light being provided to the various pixels, including a blue band 405, a green band 410, and a red band 420. For the sake of comparison, two conventional photo responses are shown, a first response 430 for a standard pixel element corresponding to the wavelength, and a second response 440 for a thin backend (backside illuminated) pixel element corresponding to the wavelength. As can be seen, the photo response for the various wavelengths are such that:

blue 405<green 410<red 420.

Referring again to FIG. 3, OPC features are applied to increase the size of the blue microlens image 205 in a direction towards the green microlens images 210 and 215. In the drawing of FIG. 3, the features are graphically represented as a larger dotted box. It is understood that different features, or different shaped features, can be used for OPC, as is well known in the art and as dependent on the photolithography equipment being used. As a result, the corresponding microlenses are closer to each other. For example, in FIG. 2, the microlenses 155b, 155g are next to each other without a gap 165 therebetween. Similarly, OPC features (or the lack thereof) are applied to decrease the size of the red microlens image 220 in a direction away from the green microlens images 210 and 215. As a result, the corresponding microlenses are further from each other. Referring again to the example in FIG. 2, the microlenses 155g, 155r have a gap 160 therebetween. It is understood that various degrees of OPC can be applied to produce different amounts of gaps (or lack thereof) to achieve a desired result.

Referring again to FIG. 4, in the present example, a resulting photo response 450 is provided by the modified microlens images 205-220 of the mask 200. As can be seen, the photo response at the blue wavelength 405 is improved, and is closer to that of the photo response at the green wavelength 410 and red wavelength 420.

Figure 5:
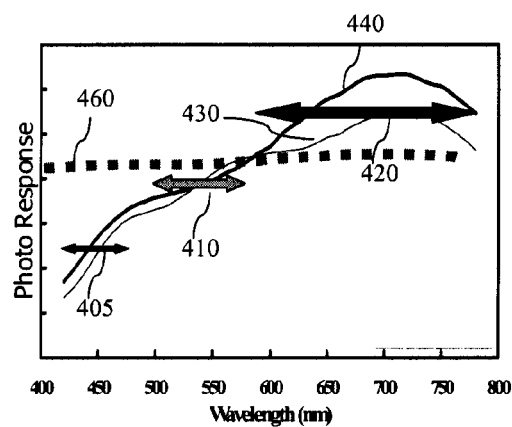

Referring now to FIG. 5, in another embodiment, the layout of microlens images 205, 210, 215, and 220 (FIG. 3) are specifically modified in size and shape to accommodate for the differences in photo responses 405, 410, and 420. Specifically, a ratio of the photo responses for blue:green:red is measured to be about 5:8:12, as shown by the first response 430. It is understood that a different ratio may be obtained for the second response 440 or other response, as so determined. Accordingly, the size ratio of the blue microlens image 205: green microlens image 210, 215: red microlens image 220 is also set to 5:8:12. As a result, a near-linear photo response 460 is provided across all of the pixel elements.

Thus, several different embodiments have been shown for implementing different features of the present invention. In one embodiment, a method is provided for making an image sensor array. The method includes providing a substrate having first and second image sensors located therein and forming first and second filters proximate to the first and second image sensors, respectively. First and second microlenses are formed proximate to the first and second filters, respectively, such that the first microlens has a larger effective area than the second microlens.

In some embodiments, the method further includes providing the substrate with a third image sensor located therein and forming a third filter proximate to the third image sensor. A third microlens is formed proximate to the third filter, such that the second microlens has a larger effective area than the third microlens.

In some embodiments, the first, second and third filters are configured to transmit blue, green, and red light, respectively.

In some embodiments, the steps of forming the three microlenses include utilizing a mask with different sized first, second and third areas corresponding to the first, second, and third microlenses, respectively. In some embodiments, at least one of the steps of forming the three microlenses includes utilizing optical proximity correction differently on first, second and third mask areas corresponding to the first, second, and third microlenses, respectively.

In another embodiment of the present invention, an image sensor array is provided. The image sensor array includes a substrate having a plurality of image sensors located therein and a microlens layer. The microlens layer includes a plurality of microlenses located over the substrate, each of the plurality of microlenses including a substantially convex portion substantially aligned over a corresponding one of the plurality of image sensors. At least two of the microlenses of the microlens layer have different effective areas.

In another embodiment of the present invention, an image sensor array is provided. The image sensor array includes a substrate having at least three image sensors located therein. The image sensor array also includes a blue filter positioned proximate to the first image sensor; a green filter proximate to the second image sensor; and a red filter proximate to the third image sensor A first microlens is positionally arranged with the blue filter and the first image sensor; a second microlens is positionally arranged with the green filter and the second image sensor; and a third microlens is positionally arranged with the red filter and the third image sensor. The first microlens has a larger effective area than the second microlens, and the second microlens has a larger effective area than the third microlens.

In some embodiments, the three microlenses are formed utilizing a mask with different sized first, second and third areas corresponding to the first, second, and third microlenses, respectively.

In some embodiments, the three microlenses are formed utilizing optical proximity correction differently on at least one of the first, second and third mask areas corresponding to the first, second, and third microlenses, respectively.

In some embodiments, there is a gap between the second and third microlenses and no gap between the first and second microlenses.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. For example, the microlenses 155g, 155r, 155b are differently sized, as compared to each other, by using an advance ridge structure, as is disclosed in U.S. Ser. No. 11/064,452, which is hereby incorporated by reference. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An image sensor array, comprising:

a substrate having a plurality of image sensors located therein; and a microlens layer comprising at least a first, second, and third microlens located over the substrate, each of the plurality of microlenses including a convex portion aligned over a corresponding one of the plurality of image sensors, wherein the first, second, and third microlenses of the microlens layer have different effective areas, wherein the first and second microlenses are adjacent each other such that the second microlens is the next adjacent lens to the first microlens, and wherein the second microlens is the next adjacent microlens to the third microlens, and there is a gap between the second and third microlenses and no microlens is positioned in the gap, and wherein there the first and second microlenses are in direct contact with one and other.

2. The image sensor array of claim 1 further comprising:

a plurality of filters located between the microlens layer and the image sensors, each of the filters being aligned between an individual microlens and an individual image sensor.

3. The image sensor array of claim 2 wherein at least two microlenses are configured by at least two different mask images, and wherein at least one of the mask images includes optical proximity correction.

4. The image sensor array of claim 2 wherein the at least two microlenses are configured by at least two different shaped mask images.

5. An image sensor array, comprising:

a substrate having at least three image sensors located therein; a blue filter positioned proximate to the first image sensor, a green filter proximate to the second image sensor, and a red filter proximate to the third image sensor, and wherein the second image sensor is a next adjacent image sensor to the first image sensor, and the third image sensor is the next adjacent image sensor to at least one of the first image sensor and the second image sensor; a first microlens positionally arranged with the blue filter and the first image sensor, a second microlens positionally arranged with the green filter and the second image sensor, and a third microlens positionally arranged with the red filter and the third image sensor; wherein the first microlens has a larger effective area than the second microlens, and the second microlens has a larger effective area than the third microlens wherein the first and second microlenses are closely adjacent each other such that the first and second microlenses are in direct contact with one and other, and there is a gap between the second and third microlenses, and wherein no additional microlens is disposed in the gap.

6. The image sensor array of claim 5 wherein the three microlenses are formed utilizing a mask with different sized first, second and third areas images corresponding to the first, second, and third microlenses, respectively.

7. The image sensor array of claim 5 wherein the three image sensors are configured to receive front-side illumination.

8. The image sensor array of claim 5 wherein the first, second, and third microlenses have a size ratio of approximately 12:8:5.

9. The image sensor array of claim 6 wherein at least one of the mask images include optical proximity correction.

10. An image sensor array, comprising:

a substrate having at least three image sensors located therein; a first color filter positioned proximate to the first image sensor, a second color filter proximate to the second image sensor, and a third color filter proximate to the third image sensor; a first microlens positionally arranged with the first color filter and the first image sensor, a second microlens positionally arranged with the second color filter and the second image sensor, and a third microlens positionally arranged with the third color filter and the third image sensor, wherein the first and second microlenses are closely adjacent each other such that the first and second microlenses are in direct contact with one and other, wherein the second microlens is next to the third microlens, wherein there is a gap between the second and third microlenses, and wherein no other microlens is positioned in the gap, and wherein the gap is defined using optical proximity correction.

11. The image sensor array of claim 10:
wherein the first, second, and third microlens have a first, second and third effective area respectively, wherein the first effective area is determined by a ratio of a photo response of the first image sensor when aligned with the first color filter, wherein the second effective area is determined by a ratio of a photo response of the second image sensor when aligned with the second color filter, wherein the third effective area is determined by a ratio of a photo response of the third image sensor when aligned with the third color filter, wherein the image sensor array has approximately equivalent sensitivities to the light filtered through each of the first, second, and third color filters.

12. The image sensor array of claim 10 wherein the three microlenses are formed utilizing a mask with independently sized first, second and third images corresponding to the first, second, and third microlenses, respectively.

13. The image sensor array of claim 10 wherein the first, second, and third filters are configured to transmit blue, green, and red light, respectively.

14. The image sensor array of claim 12 wherein at least one of the mask images include optical proximity correction.

15. The image sensor array of claim 13 wherein the first microlens has a larger effective area than the second microlens, and the second microlens has a larger effective area than the third microlens.

16. The image sensor array of claim 15 wherein the first, second, and third microlenses have a size ratio of approximately 12:8:5.

* * * * *